United States Patent [19]

Kohara

[11] Patent Number: 4,907,061
[45] Date of Patent: Mar. 6, 1990

[54] ELECTRONIC DEVICE

[75] Inventor: Masanobu Kohara, Hyogo, Japan

[73] Assignee: Mitsubishi Denki Kabushiki Kaisha, Tokyo, Japan

[21] Appl. No.: 107,396

[22] Filed: Oct. 6, 1987

[30] Foreign Application Priority Data

Oct. 8, 1986 [JP] Japan .................. 61-240693

[51] Int. Cl.$^4$ ............................................ H01L 23/02
[52] U.S. Cl. ........................................ 357/74; 357/70; 357/72; 357/80
[58] Field of Search ............... 357/70, 74, 72, 80; 174/52.4

[56] References Cited

U.S. PATENT DOCUMENTS

| | | | |
|---|---|---|---|
| 3,868,724 | 2/1975 | Perrino | 357/70 |
| 4,210,926 | 7/1980 | Hacke | 357/70 |
| 4,460,825 | 7/1984 | Haghiri-Tehrani et al. | 357/70 |
| 4,701,781 | 10/1987 | Sankhagowit | 357/70 |
| 4,701,999 | 10/1987 | Palmer | 357/70 |

FOREIGN PATENT DOCUMENTS

| | | | |
|---|---|---|---|
| 52-11767 | 1/1977 | Japan | 357/70 |
| 52-30184 | 3/1977 | Japan | 357/70 |
| 52-37769 | 3/1977 | Japan | 357/70 |
| 55-52250 | 4/1980 | Japan | 357/70 |

Primary Examiner—Rolf Hille
Assistant Examiner—Hoanganh Le
Attorney, Agent, or Firm—Gifford, Groh, Sheridan, Sprinkle and Dolgorukov

[57] ABSTRACT

The electronic device relating to the invention is that in which an electrode is formed on the rear side surface of a semiconductor element, a circuit wiring and an external electrode connected electrically to one end of the circuit wiring are formed on the rear side surface of a flexible insulating film with a first opening provided therefor, a lead terminal overhanging to the first opening is connected electrically to the other end of the circuit wiring, a second opening is formed on the flexible insulating film so as to expose a part of the external electrode, a package substrate is constituted of the flexible insulating film in tape assembly system, the circuit wiring, the external electrode and the lead terminal, the semiconductor element is disposed on the rear side surface side of the flexible insulating film under the first opening and the lead terminal is connected electrically and mechanically thereto, a part or the whole of the semiconductor element, the electrode, the lead terminal, a part of the circuit wiring and the first opening are sealed with a sealing resin, a semiconductor device is constituted of the semiconductor element, the electrode, the package substrate and the sealing resin, the semiconductor device is mounted in a recession formed on the front side of a thin flexible substrate like IC card so as to make the front side surface of the flexible insulating film coincide with the front side surface of the thin flexible substrate.

5 Claims, 2 Drawing Sheets

ELECTRONIC DEVICE

BACKGROUND OF THE INVENTION

1. Field of the Invention

The present invention relates to an electronic device, and is particularly concerned with an electronic device with a semiconductor device mounted on a thin flexible substrate.

2. Description of the Prior Art

An ultrathin IC card 0.76 mm or so in thickness is provided hitherto as such electronic device. A conventional wire bonding system and a so-called tape assembly system (or TAB - tape automated bonding otherwise) using a flexible organic insulating film are employed for mounting a semiconductor device used on the IC card. The tape assembly system is advantageous of realizing a thinner package mounting and automation. Various modes are conceivable for mounting the semiconductor device according to the tape assembly system.

FIG. 4 is a sectional view showing a structure of a prior art semiconductor device for IC card.

In the drawing, a protuberant electrode 2 is formed on the front side surface 1a of a semiconductor element 1. A flexible organic insulating film 30 consisting of polyimide resin, glass epoxy resin and the like has an opening 31, and a circuit wiring 32 and an external electrode 33 of the semiconductor device which is connected electrically to one end of the circuit wiring 32 are formed on the front side surface 30a of the flexible organic insulating film 30. A lead terminal 34 is connected electrically to the other end of the circuit wiring 32, and the lead terminal 34 overhangs the opening 31. The flexible organic insulating film 30, the circuit wiring 32, the external electrode 33 and the lead terminal 34 constitute a package substrate 300. The semiconductor element 1 is disposed to position on a side of the rear side surface 30b of the flexible organic insulating film 30 under the opening 31 of the package substrate 300. The lead terminal 34 is disposed so as to come on the protuberant electrode 2, and the lead terminal 34 is connected electrically and mechanically to the protuberant electrode 2. A part of the semiconductor element 1, the protuberant electrode 2, the lead terminal 34, a part of the circuit wiring 32 and the opening 31 are sealed with a sealing resin 40 such as epoxy resin or the like. The sealing resin 40 prevents the semiconductor element 1 and others from being contaminated externally and influenced mechanically.

FIG. 5 is a sectional view showing a construction of a conventional IC card.

In the drawing, a recess 51 is formed on a front side of a flexible card 50 consisting of polyvinyl chloride resin or the like. The semiconductor device of FIG. 4 is mounted in the recess 51 with a side of the circuit wiring 32 coming on the front side of the card 50 and the front side surface 30a of the flexible organic insulating film 30 is made to coincide with the front side surface 50a of the card 50. The mounting is performed by embedding the semiconductor device in the recess 51 or by sticking the semiconductor device embedded once in the recess 51 with an adhesive to the recess 51. An overcoat film 60 about 80 μm thick is formed on the front side surface of the semiconductor device and also on the front side surface 50a of the card 50 so as to flatten the front side surface of the semiconductor device. The overcoat film 60 has an opening 61 through which the external electrode 33 is exposed partly, and thus the external electrode 33 can be brought electrically into contact externally. In the example, the IC card is 0.76 mm or so in thickness, and the IC card surface must be smoothened to a flat.

Further in FIG. 4, the semiconductor device is constructed to have the semiconductor element 1 partly sealed with the sealing resin 40 is exemplified, however, such semiconductor device as is structured to have the semiconductor element 1 sealed entirely with the sealing resin including the rear side surface 1b thereof is also available otherwise.

Then, in a report titled "IC CARD: ASSEMBLY TECHNOLOGY AND RELIABILITY" by Shuji Hiranuma and 3 others at IMC 1986 Proceedings, Kobe, May 28 to 30, 1986, there given is a construction such that a semiconductor chip is fixed on a glass epoxy module substrate with TAB banp and TAB lead, and the module is mounted on a core film to a card unit.

Further, a constructional example of wire bonding system and TAB system is given as a mounting method of LSI for IC card in "IC CARD - ITS TECHNOLOGY AND SOCIAL DEVELOPMENT" issued by Nippon Industry Technology Center on Mar. 28, 1986.

Meanwhile, in a conventional IC card, the circuit wiring 32 is formed through patterning a metallic film consisting of a copper foil or the like about 35 μm thick generally which is formed on the front side surface 30a of the flexible organic insulating film 30 according to photoetching or other available process, therefore a finished surface of the semiconductor device is rugged 35 μm or so. For prevention a resin called solder resist is applied on the surface of the circuit wiring 32, which is still not to remove the ruggedness thoroughly. Then, since the circuit wiring 32 and the external electrode 33 are disposed on the front side surface 30a of the flexible organic insulating film 30, it is difficult to flatten the front side surface 40a of the sealing resin 40. Consequently, if the overcoat film 60 is applied after the semiconductor device is mounted on the card 50, a ruggedness on the front side surface of the semiconductor device cannot be absorbed thoroughly, thus remaining somewhat thereon. Further, the overcoat film 60 is about 80 μm in thickness, therefore the semiconductor device must be thinned entirely by the thickness of the overcoat film 60 so as to obtain an IC card 0.76 mm thick, thus making the process for semiconductor device more difficult. Then, since the circuit wiring 32 is exposed on the surface of the semiconductor device, the circuit wiring 32 is still visible externally after the semiconductor device is mounted on the card 60, which is not preferable for appearance.

SUMMARY OF THE INVENTION

The invention has been done to solve the problems mentioned above, and its object is to obtain an IC card wherefore the front side surface can be flattened and the circuit wiring is not visible externally.

The electronic device relating to the invention is that in which an electrode is formed on the rear side surface of a semiconductor element, a circuit wiring and an external electrode connected electrically to one end of the circuit wiring are formed on the rear side surface of a flexible insulating film with a first opening provided therefor, a lead terminal overhanging the first opening is connected electrically to the other end of the circuit wiring, a second opening is formed on the flexible insulating film so as to expose a part of the external electrode, a package substrate is constituted of the flexible insulating film in tape assembly system, the circuit wiring, the external electrode and the lead terminal, the semiconductor element is disposed on the rear side surface side of the flexible insulating film under the first opening and the lead terminal is connected electrically and mechanically thereto, a part or the whole of the semiconductor element, the electrode, the lead terminal, a part of the circuit wiring and the first opening are sealed with a sealing resin, a semiconductor device is constituted of the semiconductor element, the electrode, the package substrate and the sealing resin, the semiconductor device is mounted in a recess formed on the front side of a thin flexible substrate like IC card so as to make the front side surface of the flexible insulating film coincide with the front side surface of the thin flexible substrate.

In the invention, the circuit wiring is formed on the rear side surface of the flexible insulating film, the semiconductor element is disposed on the rear side surface side of the flexible insulating film under the first opening, and the front side surface of the flexible insulating film is made to coincide with the front side surface of the thin flexible substrate, therefore the sealing resin surface of the first opening can be flattened and also made to coincide with the front side surface of the flexible insulating film, and thus the front side surface of the electronic device can be flattened. Then, the circuit wiring is formed on the rear side surface of the flexible insulating film and hence is not visible externally. Further, the external electrode can be brought electrically into contact externally by forming the second opening so as to expose the external electrode partly to the flexible insulating film. Besides, since the front side surface of the electronic device can be flattened, an overcoat film need not be formed particularly thereon.

DETAILED DESCRIPTION OF PREFERRED EMBODIMENTS

The invention will now be described in detail of its preferred embodiments with reference to the accompanying drawings. In the embodiments, a description is omitted accordingly on such portion as is duplicated of the description of prior art.

Figure 1:
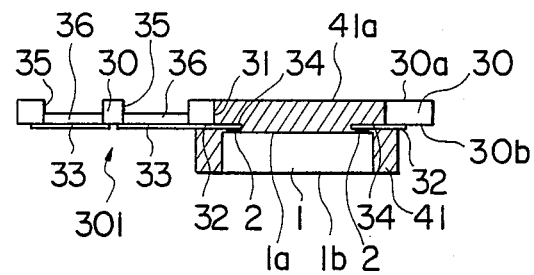
FIG. 1 is a sectional view showing a structure of a semiconductor device used on an IC card embodying the invention.

FIG. 1 is a sectional view showing a structure of a semiconductor device used on an IC card embodying the invention.

In the drawing, the circuit wiring 32 and the external electrode 33 of the semiconductor device which is connected electrically to one end of the circuit wiring 32 are formed on the rear side surface 30b of the flexible insulating film 30 having the opening 31, or a first opening. The lead terminal 34 is connected electrically to the other end of the circuit wiring 32, and the lead terminal 34 overhangs the opening 31. An opening 35, or a second opening, reaching the external electrode 33 is formed on the flexible organic insulating film 30. A metallic protrusion 36 connected electrically to the external electrode 33 is formed on the opening 35, and thus the metallic protrusion 36 is ready for electrically contacting externally. The metallic protrusion 36 is formed by depositing a metallic film on the opening 35 through electroplating, vapor coating, spattering or other process or by applying a metallic foil cut to the size to the opening 35. The flexible organic insulating film 30, the circuit wiring 32, the external electrode 33, the lead terminal 34 and the metallic protrusion 36 constitute a package substrate 301. The semiconductor element 1 is disposed so as to come on a side of the rear side surface 30b of the flexible organic insulating film 30 under the opening 31. The lead terminal 34 is aligned with the protuberant electrode 2 and so placed thereon, and the lead terminal 34 is connected electrically and mechanically to the protuberant electrode 2. A part of the semiconductor element 1, the protuberant electrode 2, the lead terminal 34, a part of the circuit wiring 32 and the opening 31 are sealed up with a sealing resin 41 such as epoxy resin or the like. Then, a front side surface 41a of the sealing resin 41 is flat to flatten the front side surface 1a of the semiconductor element 1 and is made to coincide with the front side surface 30a of the flexible organic insulating film 30. Such sealing with resin is realizable as the circuit wiring 32 and the external electrode 33 are formed on the rear side surface 30b of the flexible organic insulating film 30. A so-called transfer mode process, a method wherein a liquid resin is dropped onto the semiconductor element 1 and others to setting, and a method wherein an unset resin which is molded to a predetermined shape is placed on the semiconductor element 1 and the resin is heated to fusion are used for the sealing with resin. Then, for better precision in thickness of the semiconductor device, the surface of the sealing resin may be ground after setting, thereby flattening further the surface of the semiconductor device. Besides, the metallic protrusion 36 is not necessary when the organic flexible insulating film 30 is thin in thickness, and a height of the metallic protrusion 36 will be increased according as the organic flexible insulating film 30 gets thick. The reason is that the metallic protrusion 36 can be electrically contacted easier externally thereby.

Figure 2:
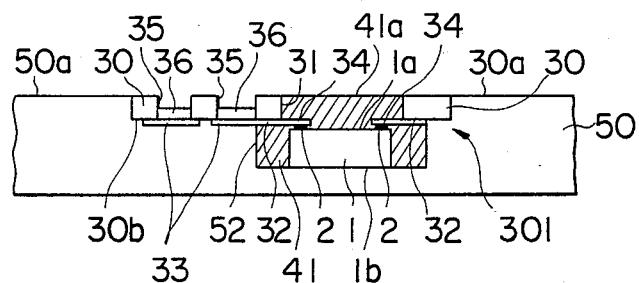
FIG. 2 is a sectional view showing a structure of an IC card given in one embodiment of the invention.

FIG. 2 is a sectional view showing a structure of an IC card given in one embodiment of the invention.

In the drawing, a recess 52 is formed on a front side of the flexible card 50 which corresponds to a thin flexible substrate. The semiconductor device of FIG. 1 is mounted in the recess 52 with the front side surface 30a of the flexible organic insulating film 30 coincident with the front side surface 50a of the card 50. Since the semiconductor device of FIG. 1 has the front side surface flattened by the flexible organic insulating film 30 and the sealing resin 41, the front side surface of the semiconductor device can be finished within the same plane as the front side surface 50a of the card 50. Thus, the overcoat film need not be formed on the front side surface of the semiconductor device and also on the front side surface 50a of the card 50, and an overall thickness of the semiconductor device can be increased correspondingly thereto to an easier manufacture of the semiconductor device. Then, the circuit wiring 32 is formed on the rear side surface 30b of the flexible organic insulating film 30 to come within the semiconductor device, therefore the circuit wiring 32 is not visible externally. Besides, In the embodiment, the sealing resin may be formed also on the rear side surface 1b of the semiconductor element 1, thereby sealing the semiconductor element 1 entirely.

Figure 3:
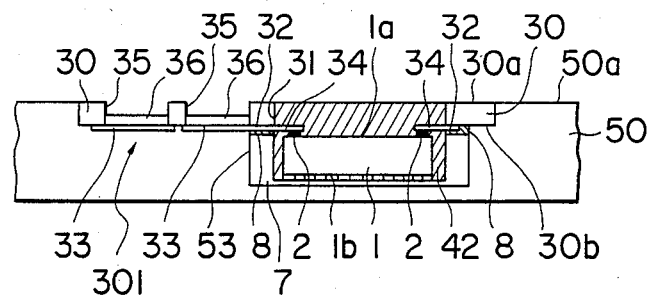
FIG. 3 is a sectional view showing a structure of an IC card given in another embodiment of the invention.
Figure 4:
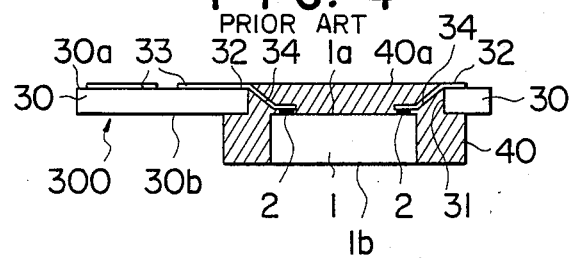
FIG. 4 is a sectional view showing a structure of a semiconductor device for conventional IC card.
Figure 5:
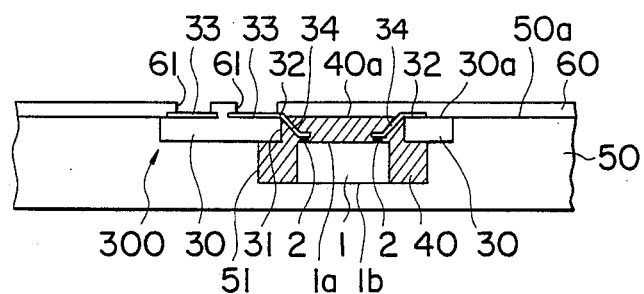
FIG. 5 is a sectional view showing a structure of the conventional IC card.

FIG. 3 is a sectional view showing a structure of an IC card given in another embodiment of the invention.

In the drawing, a receptacle 7 is disposed under the opening 31 of the package substrate 301, and an end portion of the receptacle 7 is bonded to the package substrate 301 with an adhesive 8. The semiconductor element 1 is contained in the receptacle 7. After the receptacle 7 is bonded to the package substrate 301, the opening 31 and the receptacle 7 are charged with a sealing resin 42, and the semiconductor element 1 is entirely sealed with the sealing resin 42. A recess 53 is formed on a front side of the card 50. The semiconductor device constituted of the semiconductor element 1, the protuberant electrode 2, the package substrate 301 and the sealing resin 42 is mounted in the recess 53 together with the receptacle 7. The method provides an advantage for trimming an outline of the semiconductor device.

Then, in the above-described embodiment, the IC card with a semiconductor device mounted on the card is exemplified, however, the invention can also be applied to other electronic device than IC card with the semiconductor device mounted on a thin flexible substrate.

As described above, according to the invention, the circuit wiring is formed on the rear side surface of the flexible insulating film, the semiconductor element is disposed on the rear side surface side of the flexible insulating film under the first opening, and the front side surface of the flexible insulating film is made to coincide with the front side surface of the thin flexible substrate, therefore the sealing resin surface of the first opening can be flattened and also made to coincide with the front side surface of the flexible insulating film, and thus the front side surface of the electronic device can be flattened. Then, the circuit wiring is formed on the rear side surface of the flexible insulating film to come within the semiconductor device, therefore the circuit wiring is not visible externally. Further, the external electrode can be brought electrically into contact externally by forming the second opening so as to expose the external electrode partly to the flexible insulating film. Besides, since the front side surface of the electronic device is flattened, an overcoat film need not be formed particularly thereon, and thus an overall thickness of the semiconductor device can be increased accordingly, thereby facilitating a manufacture of the semiconductor device.

What is claimed is:

1. An electronic device, comprising:
    a semiconductor element having a front side surface and a rear side surface;
    a flexible insulating film having a front side surface and a rear side surface;
    an electrode formed on said front side surface of said semiconductor element;
    a circuit wiring, and an external electrode connected electrically to one end of the circuit wiring, both formed on said rear side surface of said flexible insulating film;
    said flexible insulating film being provided with a first opening;
    a lead terminal connected electrically to the other end of said circuit wiring and overhanging said first opening;
    said flexible insulating film being provided with a second opening exposing a part of said external electrode;
    said flexible insulating film, circuit wiring, external electrode and lead terminal constituting a package substrate;
    said semiconductor element being disposed on said rear side surface of said flexible insulating film under said first opening, said lead terminal being connected electrically and mechanically to said electrode formed on said front side surface of said semiconductor element
    a sealing resin sealing at least a part of said semiconductor element, said external electrode, said lead terminal, a part of said circuit wiring and said first opening;
    said semiconductor element, said external electrode, said package substrate, and said sealing resin constituting a semiconductor device;
    a thin flexible substrate;
    said thin flexible substrate being provided with a recess, on its front side;
    said semiconductor device being mounted in said recess with the front side surface of said flexible insulating film coincident with the front side surface of said thin flexible substrate.

2. The electronic device as defined in claim 1, provided further with a metallic film connected electrically to said external electrode at said second opening.

3. The electronic device as defined in claim 2, provided further with a receptacle;
    said receptacle being disposed under said first opening and being bonded to said package substrate, said semiconductor element being contained in said receptacle, said sealing resin being provided in a clearance between said semiconductor element and said receptacle.

4. The electronic device as defined in claim 1, provided further with a receptacle;
    said receptacle being disposed under said first opening and being bonded to said package substrate, said semiconductor element being contained in said receptacle, said sealing resin being provided in a clearance between said semiconductor element and said receptacle.

5. A card type electronic device comprising:
    a flexible insulating film having a front side surface and a rear side surface, and forming a first and a second opening,
    an inner lead formed on the rear side surface of said flexible insulating film with one end thereof extending into said first opening,
    an external lead formed on the rear side surface of said flexible insulating film, said external lead having an exposed surface at said second opening and being electrically connected to said inner lead,
    a semiconductor element located at said first opening of said flexible insulating film and disposed on said rear side surface, and having an electrode electrically connected to said inner lead,
    a sealing resin sealing at least said first opening of said flexible insulating film, the surface of said semiconductor element, said one end of said inner lead and said semiconductor element, and having a flat surface formed in the plane of the front surface of said flexible insulating film, and
    a flexible substrate having a recess housing said flexible insulating film and said semiconductor element, and having a flat front surface formed in the plane of the front surface of said flexible insulating film.

* * * * *